United States Patent
Schauer et al.

(10) Patent No.: US 9,240,316 B2
(45) Date of Patent: Jan. 19, 2016

(54) METHOD FOR PRODUCING AN EPITAXIALLY COATED SEMICONDUCTOR WAFER

(75) Inventors: Reinhard Schauer, Laufen (DE); Christian Hager, Kastl (DE)

(73) Assignee: SILTRONIC AG, Munich (DE)

( * ) Notice: Subject to any disclaimer, the term of this patent is extended or adjusted under 35 U.S.C. 154(b) by 1998 days.

(21) Appl. No.: 12/386,220

(22) Filed: Apr. 15, 2009

(65) Prior Publication Data

US 2009/0277376 A1    Nov. 12, 2009

(30) Foreign Application Priority Data

May 9, 2008    (DE) .......................... 10 2008 023 054

(51) Int. Cl.
| | | |
|---|---|---|
| *H01L 21/324* | (2006.01) | |
| *H01L 21/02* | (2006.01) | |
| *C30B 33/02* | (2006.01) | |
| *C30B 25/02* | (2006.01) | |

(Continued)

(52) U.S. Cl.
CPC .......... *H01L 21/02532* (2013.01); *C30B 25/02* (2013.01); *C30B 25/10* (2013.01); *C30B 29/06* (2013.01); *C30B 33/02* (2013.01); *H01L 21/0262* (2013.01); *H01L 21/02381* (2013.01); *H01L 21/02664* (2013.01); *H01L 21/324* (2013.01)

(58) Field of Classification Search
CPC ............ H01L 21/02664; H01L 21/324; H01L 21/02532; H01L 21/02381; H01L 21/0262; C30B 33/02

USPC ........ 117/84, 88, 94, 97, 98, 105, 106, 107, 3
See application file for complete search history.

(56) References Cited

U.S. PATENT DOCUMENTS

| | | | | |
|---|---|---|---|---|
| 4,874,464 A | * | 10/1989 | Goodwin et al. | ................ 117/97 |
| 5,198,071 A | * | 3/1993 | Scudder et al. | ................. 117/84 |
| 6,129,047 A | | 10/2000 | Nakamura | |

(Continued)

FOREIGN PATENT DOCUMENTS

| | | |
|---|---|---|
| CN | 1936109 A | 3/2007 |
| DE | 10328842 A1 | 1/2005 |

(Continued)

OTHER PUBLICATIONS

English Computer translation of JP 2001-203209 (2001).*

(Continued)

*Primary Examiner* — Matthew Song
(74) *Attorney, Agent, or Firm* — Brooks Kushman P.C.

(57) ABSTRACT

Epitaxially coated semiconductor wafers are prepared by a process in which a semiconductor wafer polished at least on its front side is placed on a susceptor in a single-wafer epitaxy reactor and epitaxially coated on its polished front side at temperatures of 1000-1200° C., wherein, after coating, the semiconductor wafer is cooled in the temperature range from 1200° C. to 900° C. at a rate of less than 5° C. per second. In a second method for producing an epitaxially coated wafer, the wafer is placed on a susceptor in the epitaxy reactor and epitaxially coated on its polished front side at a deposition temperature of 1000-1200° C., and after coating, and while still at the deposition temperature, the wafer is raised for 1-60 seconds to break connections between susceptor and wafer produced by deposited semiconductor material before the wafer is cooled.

13 Claims, 5 Drawing Sheets

(51) Int. Cl.
*C30B 25/10* (2006.01)
*C30B 29/06* (2006.01)

(56) References Cited

U.S. PATENT DOCUMENTS

| | | |
|---|---|---|
| 2001/0037761 A1 | 11/2001 | Ries et al. |
| 2005/0183829 A1* | 8/2005 | Goodman et al. ....... 156/345.51 |
| 2006/0201413 A1* | 9/2006 | Nishizawa ..................... 117/84 |
| 2007/0062438 A1 | 3/2007 | Schauer et al. |
| 2009/0004426 A1* | 1/2009 | Falster et al. ................ 428/64.1 |

FOREIGN PATENT DOCUMENTS

| | | |
|---|---|---|
| DE | 102005045338 A1 | 4/2007 |
| JP | 63271922 A | 11/1988 |
| JP | 03-136320 A | 6/1991 |
| JP | 06-045250 A | 2/1994 |
| JP | 09199416 A | 7/1997 |
| JP | 11-283987 | 10/1999 |
| JP | 2000269143 A | 9/2000 |
| JP | 2001203209 A * | 7/2001 |
| JP | 2004356355 A | 12/2004 |
| JP | 2009032973 A | 2/2009 |
| KR | 2003-0019471 A | 3/2003 |
| WO | 02/03445 A1 | 1/2002 |

OTHER PUBLICATIONS

Per-Ove Hansson, 300 mm Epitaxy: challenges and opportunities from a wafer manufacturer's point of view, Microelectronic Engineering 45 (1999), pp. 127-133.

* cited by examiner

Fig. 6

METHOD FOR PRODUCING AN EPITAXIALLY COATED SEMICONDUCTOR WAFER

CROSS-REFERENCE TO RELATED APPLICATIONS

This application claims priority to German application DE 10 2008 023 054.5 filed May 9, 2008, which is herein incorporated by reference.

BACKGROUND OF THE INVENTION

1. Field of the Invention

The invention relates to methods for producing a semiconductor wafer having a front side coated by chemical vapor deposition (CVD).

2. Background Art

During chemical vapor deposition, in particular during the deposition of an epitaxial layer on a polished semiconductor wafer, inter alia, two phenomena may occur which are known by the terms "autodoping" and "halo".

In "autodoping" dopants pass from the rear side of the semiconductor wafer via the gas phase into the deposition gas, which is fed over the front side of the semiconductor wafer. They are then incorporated into the epitaxial layer, predominantly in the edge region of the front side of the semiconductor wafer, and therefore cause more or less pronounced undesired radial fluctuation in the resistivity of the epitaxial layer.

"Halo" denotes a scattered light effect which is caused by light-scattering structures on the rear side of the semiconductor wafer which becomes apparent when a collimated light beam is shone onto the rear side of the semiconductor wafer. The structures mark transitions on the surface of the rear side of the semiconductor wafer, at which regions with a native oxide layer adjoin regions where such an oxide layer has not been or is no longer present. These transitions occur when removal of the native oxide layer during the pretreatment in a hydrogen atmosphere ("pre-bake") was incomplete before the actual epitaxial deposition. One means of quantifying this effect consists of a scattered-light measurement of the haze (turbidity, opacity), for example with an SP1 light scattering meter from KLA Tencor, in the so-called DNN ("DarkField Narrow Normal") or DWN ("DarkField Wide Normal") channel.

In order to avoid problems with "autodoping" U.S. Pat. No. 6,129,047 proposes providing slits in the bottom of the susceptor's depression ("pocket") holding the semiconductor wafer, wherein the slits are arranged on the outer edge of the bottom of the susceptor. Dopants defusing out from the rear side of the semiconductor wafer can be removed from the reactor without reaching the front side of the semiconductor wafer, by a purging gas fed through slits in the susceptor onto the wafer rear side.

According to U.S. Pat. No. 6,596,095 B2, there are small holes in the entire bottom of the susceptor for the same purpose. Here, too, the dopant diffusing out from the rear side of the semiconductor wafer is transported away by guiding a purging gas past the wafer. These measures are also effective against "halo" formation because they facilitate removal of the native oxide layer, since gaseous reaction products that arise when the native oxide is dissolved are likewise transported away through the holes in the bottom and the purging gas flowing past.

DE 10328842 discloses a susceptor having a gas-permeable structure with a porosity of at least 15% and a density of 0.5 to 1.5 g/cm$^3$. By using such a porous susceptor, the gaseous reaction products which are formed during the pretreatment when the native oxide layer is dissolved, and also dopants diffusing from the semiconductor wafer to be coated, can escape through the pores of the susceptor to the rear side of the susceptor, and be taken up by means of a purging gas flow and removed from the reactor. Using the susceptor therein described also avoids undesired nanotopography effects on the rear side of the semiconductor wafer, which occur in the case of susceptors with holes. Holes in the susceptor influence the temperature field on the front side and rear side of the semiconductor wafer to be coated, which leads to locally different deposition rates and thus to said nanotopography effects. The term nanotopography denotes height fluctuations in the nanometer range, which are measured over a lateral extent of 0.5 mm to 10 mm.

A further problem in the epitaxy of semiconductor wafers involves stresses in the epitaxially coated semiconductor wafers, which can lead to dislocations and slips.

A number of methods for identifying slips in semiconductor wafers are known: on the one hand by visual inspection with collimated light by means of devices for inspecting the surface of semiconductors wafers, or else with devices which are suitable for determining the nanotopography.

The most sensitive method in this regard, however, is SIRD ("Scanning Infrared Depolarization"), since SIRD is able not only to detect slips but also able to measure photoelastic stresses. The SIRD method for identifying stress fields, slips, sliplines, epitaxial defects, which is based on inducing optical birefringence, is described for example in U.S. Pat. No. 6,825,487 B2.

Thermally induced stresses in epitaxially coated semiconductor wafers can be avoided if, during the epitaxy of semiconductor wafers, the temperatures are reduced during the pretreatment steps in a hydrogen atmosphere (bake) and with the addition of hydrogen chloride to the hydrogen atmosphere (HCl-etch) and also during the actual coating step. Lower coating temperatures, however, lead to an increased occurrence of undesired crystal defects such as stacking faults or typical epitaxial defects which are known by the terms "hillocks", "mounds" or "pits". At very low temperatures, polycrystalline growth may even occur. A further disadvantage is an impaired edge roll-off of the epitaxially coated layer and also a deterioration in the local flatness of the semiconductor wafer (geometry, SFQR). In addition, the growth rate decreases with lower deposition temperatures, which makes the process less economical.

Consequently, reducing the pretreatment and deposition temperatures is not acceptable at all, owing to the associated disadvantages.

In order to achieve good properties with regard to geometry for the epitaxial coating in single-wafer reactors (e.g. a Centura 300 mm reactor), it is absolutely necessary to move to high temperatures, since only then is the layer thickness distribution at the edge of the wafer suitable for obtaining or improving the initial geometry of the wafer.

At low temperatures the layer thickness in the vicinity of the edge of the wafer starts to fall and the initial geometry, which generally also already has a degree of edge roll-off, starts to deteriorate. At higher deposition temperatures, the epitaxial layer thickness exhibits a tendency to increase and this compensates for the edge roll-off of the substrate.

However, the stresses in the wafer increase greatly at higher deposition temperatures. This is due to the fact that dislocations arise and migrate more easily in the crystal since less activation energy is required for these processes at high temperatures. This in turn means that even in the case of small temperature differences between wafer and susceptor, the stresses are produced. This is associated with the fact that during coating, deposition gas also passes below the wafer and at some locations causes the wafer to grow on the susceptor. This effect is also called "bridging". Such connecting bridges between susceptor and wafer form thermal bridges and—depending on whether the susceptor or the wafer is at a higher temperature—cause heat to be conducted into the wafer or withdrawn from the wafer. This heat flow in turn leads to stresses in the wafer.

US 2001/0037761 A1 discloses subjecting the susceptor with the semiconductor wafer lying thereupon to a thermal treatment in order to achieve intrinsic gettering properties in the bulk of the wafer. In this case, intrinsic gettering is made possible by oxygen precipitates. A crystal pulled by means of the CZ method and a wafer fabricated therefrom usually comprise oxygen in a concentration of 10 to 18 ppm. What can be achieved by thermal treatment and subsequent cooling is that the wafer comprises a region below its surface which is free of oxygen precipitates, while the bulk contains such oxygen precipitates (also called BMD=bulk micro defect) which act as intrinsic getters for metallic impurities.

In an epitaxy reactor, the semiconductor wafer is for this purpose firstly brought to a temperature of at least 1175° C., preferably to higher temperatures of up to 1300° C., held at this temperature for a few seconds (e.g. 12-15 s) and then cooled, e.g. at a cooling rate of 10-15° C./second. Higher cooling rates are possible if the semiconductor wafer is removed from the susceptor. Susceptors usually have one or more openings (the so-called lift pin holes) through which the semiconductor wafer can be raised by means of pins, so-called lift pins, while the susceptor remains in the original position. A result of lifting is that the semiconductor wafer is no longer in contact with the hot susceptor, which enables higher cooling rates of 25-30° C./second.

U.S. Pat. No. 5,198,071 proposes avoiding the "bridging" effect by the initial growth rate firstly being restricted to 0.1-1 µm/minute during the epitaxial deposition. However, such low growth rates make the process uneconomical. Moreover, it is proposed that bridging material between wafer and susceptor be removed by etching after epitaxial deposition and before the cooling process (that is to say, at deposition temperature). This has the disadvantage, however, that not only the connecting bridges between wafer and susceptor but also silicon material is etched away from the wafer rear side, which can lead to a deterioration in the overall geometry of the wafer. DE102005045338 discloses applying an elevation in the form of silicon material on the rear side of a silicon wafer, which elevation at least partly compensates for the edge roll-off brought about by the silicon wafer to be epitaxially coated. The height and extent of the application on the rear side of the silicon wafer can be set in a targeted manner by a suitable choice of the gas flows and the treatment durations. This is counteracted, however, by the etching away, as proposed in U.S. Pat. No. 5,198,071, of bridging material and rear side depositions.

SUMMARY OF THE INVENTION

Accordingly, the inventors were faced with the object of providing stress-free epitaxially coated semiconductor wafers while avoiding the disadvantages of the prior art. These and other objects have been achieved by means of a method for producing an epitaxially coated semiconductor wafer, in which a semiconductor wafer, polished at least on its front side, is placed on a susceptor in a single-wafer epitaxy reactor and is coated by applying an epitaxial layer on its polished front side by chemical vapor deposition at temperatures of 1000-1200° C., wherein, after epitaxial coating has taken place, the semiconductor wafer is cooled in the temperature range from 1200° C. to 900° C. at a rate of less than 5° C. per second.

BRIEF DESCRIPTION OF THE DRAWINGS

The invention is illustrated below with reference to figures.

DETAILED DESCRIPTION OF THE PREFERRED EMBODIMENT(S)

Usually, in single-wafer reactors (e.g. Centura from AMAT or Epsilon from ASM), purging is continued for a few seconds after epitaxial coating in order to purge the process chamber free of the process gases. Cooling is then effected at a high ramp rate (>5° C./s); sometimes the lamps are even switched off entirely, or cooling is effected at a constant power. This leads to high stresses in the wafer.

According to the invention, however, cooling is effected at the still high temperatures at a low ramp rate of less than 5° C./s, preferably at 1-5° C./s, more preferably at less than or equal to 3° C./s, and especially less than or equal to 1.5° C.

By way of example, the epitaxial deposition is effected at a temperature of 1150° C. Afterward, cooling is effected in the temperature range of 1150-1050° C. at a ramp range of 1-2° C. and below 1050° C. e.g. at 3° C./s from 1050° C. to 950° C. At lower temperatures below 900° C., cooling is preferably effected at 5° C./s or greater.

The inventors have surprisingly and unexpectedly discovered that the lower ramp rate in the high temperature range, at which the energy for the migration of dislocations is still very low, prevents a large temperature difference from arising between wafer and susceptor. This also reduces the heat flow, which in turn prevents stresses and hence the migration of dislocations.

Particularly during cooling of the wafer, in the prior art processes, it is virtually impossible for the susceptor and the wafer always to be held at the same temperature. Therefore, in the prior art, stresses increasingly arose during cooling.

The object of the invention is also achieved by means of a method for producing an epitaxially coated semiconductor wafer, in which a semiconductor wafer polished at least on its front side, is placed on a susceptor in a single-wafer epitaxy reactor and is coated by applying an epitaxial layer on its polished front side by chemical vapor deposition at a deposition temperature of 1000-1200° C., wherein, after epitaxial coating has taken place, at deposition temperature, the semiconductor wafer is raised for 1-60 seconds in order to ensure that connections between susceptor and wafer that have been produced by deposited semiconductor material are broken up before the wafer is cooled.

In this case, too, it is preferred, after epitaxial coating has taken place and the raising of the wafer, for the latter to be cooled in the temperature range from 1200° C. to 900° C. at a rate of less than 5° C. per second.

The brief raising of the wafer has the effect of breaking up possible connecting bridges between wafer and susceptor (bridging). This prevents the flow of a large amount of heat between wafer and susceptor since ideally only point contacts exist in this way.

The wafer is preferably raised for a short time of approximately 1 second up to 5 seconds. In this case, the wafer is preferably raised only approximately 1 mm to approximately 2 mm. The wafer is preferably raised by means of lift pins in accordance with the prior art. Afterward, the wafer is placed onto the susceptor again in order to utilize the heat-compensating effect of the susceptor. After this brief raising of the wafer and during cooling, the wafer lies on the susceptor again.

Alternatively, the wafer is raised for a somewhat longer period of time, preferably for 10-60 s. As a result, firstly connecting bridges are once again broken (bridging) and secondly possible stresses can be annealed somewhat again at the temperatures that are still high during the raising process.

In the methods according to the invention, firstly a multiplicity of semiconductor wafers polished at least on their front sides are provided. For this purpose, a single crystal produced according to the prior art, preferably by crucible pulling according to Czochralski, is sliced into a multiplicity of semiconductor wafers by means of known slicing methods, preferably using wire saws with free abrasive grain ("slurry") or bonded abrasive grain (diamond wire).

Mechanical machining steps are furthermore carried out, such as sequential single-side grinding methods, simultaneously double-side grinding methods (DDG) or lapping. The edge of the semiconductor wafer, including any existing mechanical markings such as a notch or a flat, are generally also machined ("edge-notch grinding"). Chemical treatment steps are additionally provided, comprising cleaning and etching steps.

After the grinding, cleaning and etching steps, according to the prior art, the surface of the semiconductor wafers is preferably smoothed by material removal polishing. This is preferably done by double-side polishing (DSP), wherein the semiconductor wafers are for this purpose inserted loosely into a thin toothed disk and polished on the front and rear side simultaneously in a manner "floating freely" between an upper and a lower polishing plate covered with a polishing cloth.

The front sides of the semiconductor wafers provided are furthermore preferably polished in a manner free from streaks, for example by means of a soft polishing cloth with the aid of an alkaline polishing sol. In the literature, this step is often referred to as CMP polishing ("chemo-mechanical polishing"). After polishing, the semiconductor wafers are preferably subjected to hydrophilic cleaning and drying according to the prior art.

Epitaxial layers are subsequently deposited onto the polished front sides of the provided semiconductor wafers in a single-wafer reactor. In this case, the semiconductor wafer preferably does not lie directly on the susceptor, but rather on a ring, which in turn rests on the susceptor, such that the rear side of the semiconductor wafer faces a bottom of the susceptor. The bottom of the susceptor preferably has a gas-permeable structure (porous, e.g. felt susceptor, or perforated susceptor in accordance with the prior art). The ring is preferably a ring composed of silicon carbide. The epitaxy reactor is preferably a single-wafer reactor, more preferably a single-wafer reactor from ASM or Applied Materials (AMAT Centura Epi). The semiconductor wafers provided preferably have diameters of 150 mm, 200 mm, 300 mm and 450 mm.

During the pretreatment of the semiconductor wafer, the semiconductor wafer to be epitaxially coated is usually preheated and exposed to a purging gas, usually a hydrogen atmosphere, in order to remove a native oxide layer. After the oxide layer has been removed, an etchant, preferably hydrogen chloride, is usually added to the purging gas in order to smooth the surface of the front side of the semiconductor wafer before depositing the epitaxial layer.

In order to deposit the epitaxial layer, the semiconductor wafer to be epitaxially coated is usually brought to the deposition temperature and the front side of the semiconductor wafer is brought into contact with a deposition gas, while the rear side of the substrate wafer continues to be exposed to the influence of the purging gas. The deposition gas usually contains compounds which, after they are chemically cleaved, provide the layer-forming substances. These substances preferably include silicon, germanium, and dopants such as boron, phosphorus, or arsenic. A deposition gas is very preferably composed of trichlorosilane, hydrogen and diborane.

After the epitaxial layer has been deposited, the epitaxially coated semiconductor wafer is cooled, preferably in a flow of hydrogen which is passed through the reactor.

The effect of the ring preferably resting on the susceptor is that the semiconductor wafer has no contact with the susceptor and therefore has no or only few stress points in its surface. The semiconductor wafer is therefore largely stress-free in its surface, that is to say has virtually no mechanical stresses at all.

As an alternative to a ring resting on the susceptor (two-part wafer holder), support can also be achieved by means of an edge support on a one-part susceptor (so-called ledge support). The use of such a susceptor is especially preferred.

Furthermore, a ring composed of silicon carbide has the effect that there is a kind of insulation or thermal buffer between semiconductor wafer and susceptor. This has the effect that few thermally induced stresses, which could lead to dislocations and slips, occur even on the bearing points at the edge.

The single-wafer reactors used are usually heated from above and below by means of IR lamps.

When using a conventional susceptor (without resting ring, without ledge), the semiconductor wafer is at a higher temperature than the susceptor during the pretreatment and coating steps. Thermally induced stresses occur in this case at the points of contact with the susceptor, which in the worst case can lead to dislocations and slip of the semiconductor wafer.

In the case of a susceptor with a ring composed of silicon carbide resting thereon, however, the temperature of the ring is higher than that of the susceptor and has a temperature value close to the temperature of the semiconductor wafer. The thermal stresses occurring in the prior art can be reduced as a result. The effect also occurs if the temperature of the semiconductor wafer is lower than the temperature of the susceptor, as is the case when cooling the semiconductor wafer after the deposition process. Here, too, the ring acts as a kind of thermal buffer. It has been shown, however, that rear side depositions cannot always be avoided by using an additional ring resting on the susceptor, since deposition gas can nevertheless pass between susceptor and semiconductor wafer and thus to the rear side of the semiconductor wafer. Therefore, it is particularly advantageous to raise the wafer after epitaxial coating, in order to break up such connecting locations between semiconductor wafer and susceptor, even when an additional ring support is used.

The semiconductor wafer to be epitaxially coated is preferably a wafer composed of monocrystalline silicon, to which an epitaxial silicon layer is applied. The silicon wafer to be epitaxially coated is preferably polished at least on its front side. Preferably, the silicon wafer to be epitaxially coated is etched and polished on its rear side. Preferably, the silicon wafer to be epitaxially coated has a diameter of 150 mm, 200 mm, 300 mm or 450 mm.

The described method according to the invention is suitable for producing a semiconductor wafer which comprises a front side and a rear side, which is provided on its front side with an epitaxial layer and which is free from stresses according to photoelastic stress measurement ("SIRD") in particular in the edge region.

For example, the SIRD ("Scanning Infrared Depolarization") Metrology System from PVA TePla or the SIRD-300 device from JenaWave is suitable for determining the stresses. The sensitivity of the TePla SIRD device is 6 kPa.

Both the front side and the rear side and also the edge region of the semiconductor wafer can be investigated with these SIRD measuring devices. There is only a small edge exclusion as e.g. in the case of geometry measuring devices (usually 0.5 mm edge exclusion).

The edge region should be understood to be for example a ring-shaped area on the wafer which extends inward from the edge exclusion in the direction of the center of the wafer. In the case of a wafer having a diameter of 300 mm and SIRD measurement with an edge exclusion of 0.5 mm, this can be for example a 3 mm wide ring having an external diameter of 299 mm and an internal diameter of 293 mm (as seen from the center of the wafer, therefore, radius values of 149.5 mm to 146.5 mm).

Unless indicated otherwise, data regarding stresses in semiconductor wafers investigated by means of SIRD relate respectively to the front side and rear side and to the edge region of the semiconductor wafer.

For the characterization of stresses by means of SIRD, a stress limit value is predetermined, which preferably corresponds to the sensitivity of the device used. If no stresses above said stress limit value can be detected, the wafer should be regarded as SIRD stress free according to the metrology used. The SIRD measuring device from Jenawave makes it possible to investigate very specific regions of a wafer, e.g. only the edge region. Moreover, it is possible to exclude specific regions from the measurement and analysis, in particular the notch region and also the bearing points of the measuring device.

The semiconductor wafer is preferably a semiconductor wafer polished on the front side and provided with an epitaxial layer on the polished front side. Preferably, the semiconductor wafer is etched and polished on its rear side. Preferably, the semiconductor wafer has a diameter of 150 mm, 200 mm, 300 mm or 450 mm. The epitaxially coated semiconductor wafer is preferably a wafer composed of monocrystalline silicon, to which an epitaxial silicon layer is applied.

Figure 1:
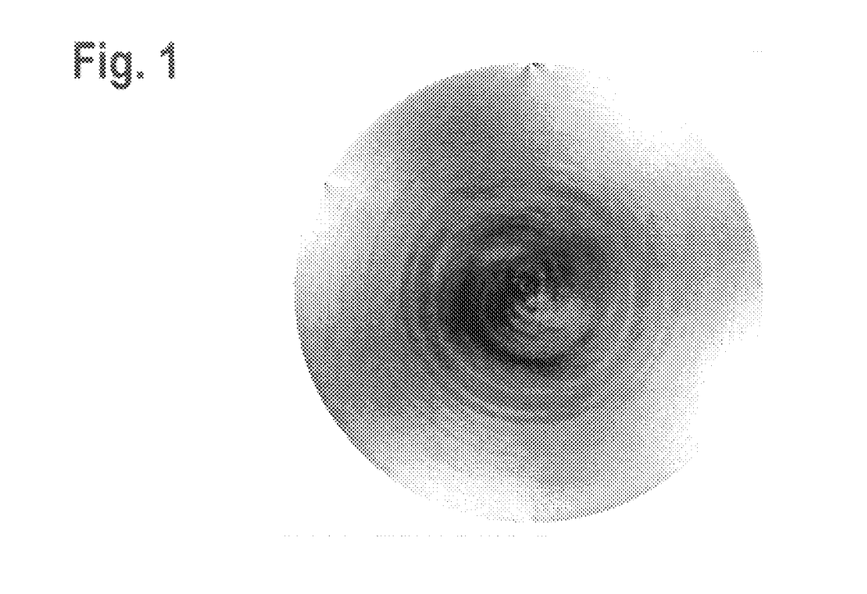
FIG. 1 illustrates the result of an SIRD measurement according to the invention.

FIG. 1 shows the result of an SIRD measurement of a semiconductor wafer epitaxially coated according to the invention. Stress fields are manifested here neither at the edge nor in the area of the semiconductor wafer. The four visible points can be attributed to three bearing points of the SIRD measuring device and the orientation notch.

Figure 2:
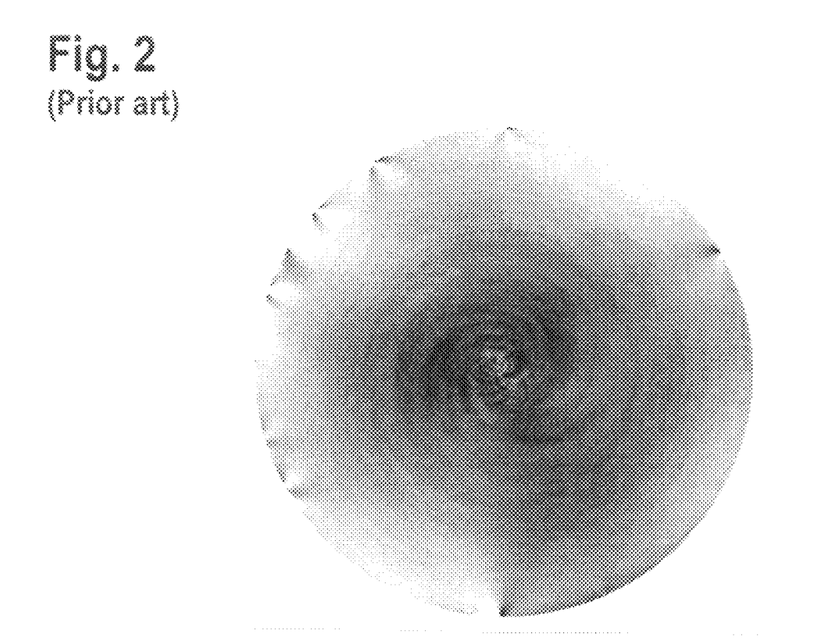
FIG. 2 illustrates the result of an SIRD measurement on an epitaxially coated wafer in accordance with the prior art.

FIG. 2 shows the result of an SIRD measurement of a semiconductor wafer epitaxially coated in accordance with the prior art. Here local stress fields are manifested at the edge of the semiconductor wafer, said stress fields corresponding to stress differences of 120 Kilopascals.

The interference patterns show no thickness variance of the wafer. "Fringes" arise through interference of the ordinary and extraordinary lasers rays, which each have a different phase velocity.

Figure 3:
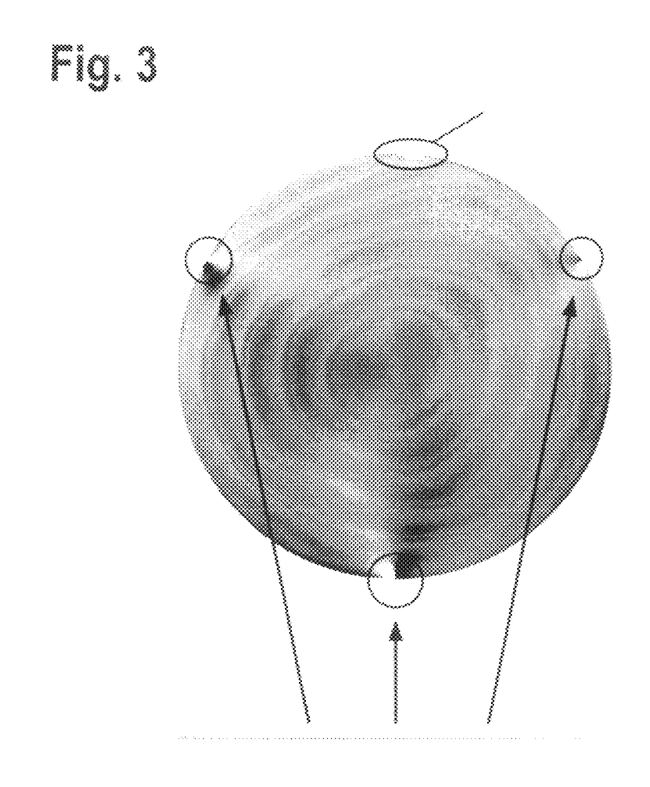
FIG. 3 illustrates bearing points at the edge of the wafer, visible during SIRD measurements.

FIG. 3 shows the meaning of the bearing points discernible in FIG. 1. Three bearing points can be seen, which are caused by the semiconductor wafer bearing on the bearing device of the SIRE measuring devices. Another point can furthermore be discerned, which is attributable to a mechanical marking such as a notch or a flat, or to a laser marking. These bearing points, and a mechanical marking possibly present, can be seen in any SIRD measurement on a semiconductor wafer. However, they are not critical stress fields which would be quantitively detectable by means of SIRD.

Figure 4:
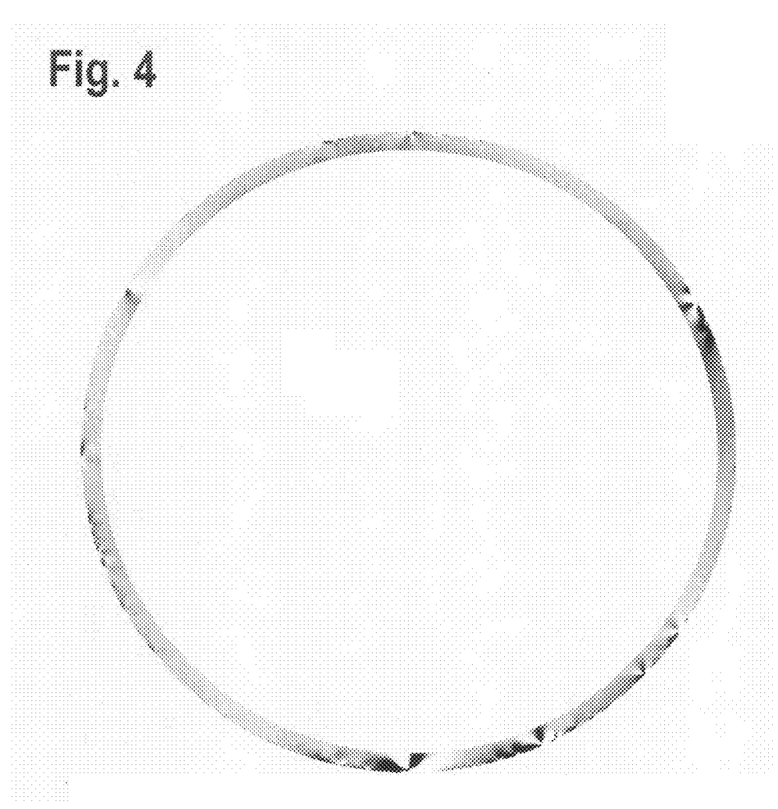
FIG. 4 illustrates the result of an SIRD measurement on an epitaxially coated wafer in accordance with the prior art.
Figure 5:
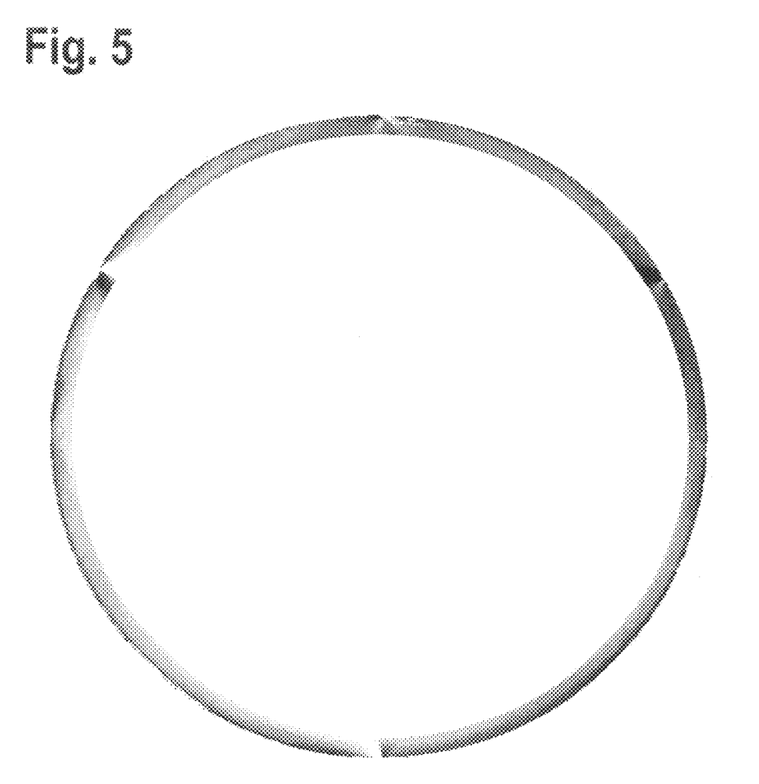
FIGS. 5 and 6 illustrate results of SIRD measurements on epitaxially coated wafers according to the invention.
Figure 6:
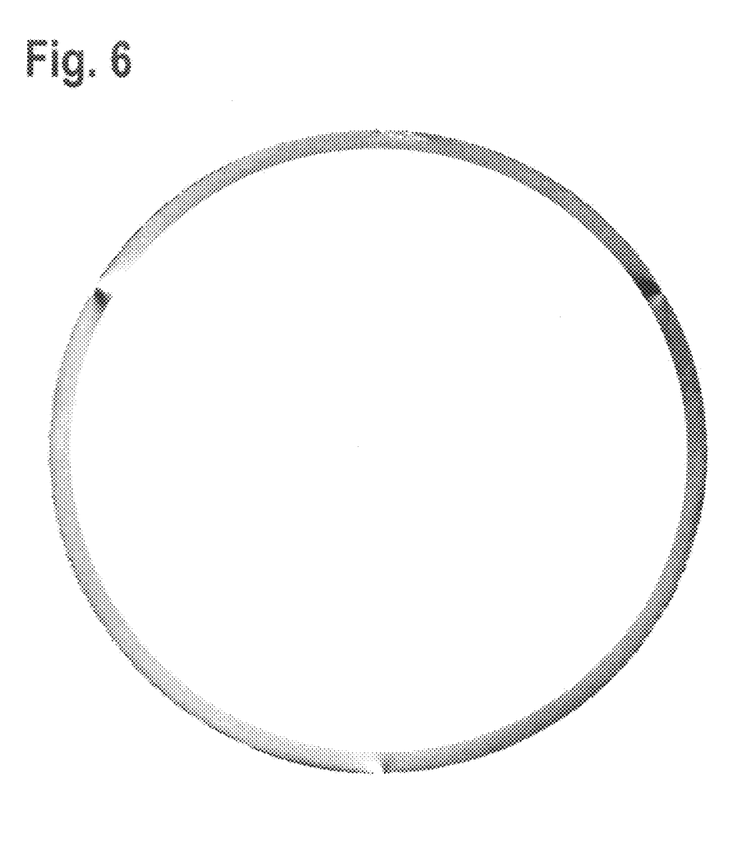

For the examples in FIGS. 4-6, an edge exclusion of 0.5 mm was used and the edge region of the wafer was investigated in a 4 mm wide ring by means of SIRD. The measurement sensitivity was 6 kPa. A porous susceptor with a ring-shaped SIC support was used in each case.

FIG. 4 shows the result of an SIRD measurement of the edge of a semiconductor wafer epitaxially coated in accordance with the prior art with standard cooling. Alongside the four points always present (bearing points and notch), further stress fields are evident here.

FIGS. 5 and 6 show results of SIRD measurements on the edge of semiconductor wafers epitaxially coated according to the invention.

The wafer in FIG. 5 was cooled according to the invention after epitaxial coating. The region investigated is stress-free in accordance with SIRD.

The wafer in FIG. 6 was briefly raised according to the invention after epitaxial coating, in order to break up connecting bridges between wafer and susceptor. Here, too, the area investigated is stress-free in accordance with SIRD.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing an epitaxially coated semiconductor wafer with reduced stress, comprising placing a semiconductor wafer polished at least on its front side on a susceptor in a single-wafer epitaxy reactor and coating by applying an epitaxial layer on its polished front side by chemical vapor deposition at temperatures of 1000-1200° C., and, after epitaxial coating has taken place, cooling the semiconductor wafer in the temperature range from 1200° C. to 900° C. at a rate of less than 5° C. per second and, after reaching a temperature of 900° C., is cooled at a rate of 5° C. per second or higher.

2. The method of claim 1, wherein the semiconductor wafer is cooled in a temperature range of 1200-900° C. at a rate of less than or equal to 3° C. per second.

3. The method as claimed in claim 2, wherein the semiconductor wafer is cooled in the temperature range of 1200-1000° C. at a rate of less than or equal to 1.5° C. per second.

4. The method of claim 1, wherein the wafer is supported by a silicon carbide ring separate from the susceptor.

5. The method of claim 1, wherein the wafer is supported on a ring-shaped ledge support in a one-piece susceptor.

6. A method for producing an epitaxially coated semiconductor wafer with reduced stress, comprising placing a semiconductor wafer polished at least on its front side on a susceptor in a single-wafer epitaxy reactor and coating by applying an epitaxial layer on its polished front side by chemical vapor deposition at a deposition temperature of 1000-1200° C., and, after epitaxial coating has taken place, at deposition temperature, raising the semiconductor wafer for 1-60 seconds such that connections between susceptor and wafer that have been produced by deposited semiconductor material are broken up before the wafer is cooled wherein, after epitaxial coating has taken place and after brief raising of the semiconductor wafer, the wafer is cooled in the temperature range from 1200° C. to 900° C. at a rate of less than 5° C. per second.

7. The method as claimed in claim 6, wherein the semiconductor wafer is cooled in a temperature range of 1200-900° C. at a rate of less than or equal to 3° C. per second.

8. The method of claim 7, wherein the semiconductor wafer, after reaching a temperature of 900° C., is cooled at a rate of 5° C. per second or higher.

9. The method as claimed in claim 6, wherein the semiconductor wafer is cooled in the temperature range of 1200-1000° C. at a rate of less than or equal to 1.5° C. per second.

10. The method of claim 9, wherein the semiconductor wafer, after reaching a temperature of 900° C., is cooled at a rate of 5° C. per second or higher.

11. The method of claim 6, wherein the semiconductor wafer, after reaching a temperature of 900° C., is cooled at a rate of 5° C. per second or higher.

12. The method of claim 6, wherein the wafer is supported by a silicon carbide ring separate from the susceptor.

13. The method of claim 6, wherein the wafer is supported on a ring-shaped ledge support in a one-piece susceptor.

* * * * *